(12) United States Patent
Yim et al.

(10) Patent No.: US 10,903,419 B2
(45) Date of Patent: Jan. 26, 2021

(54) RESISTIVE MEMORY DEVICE AND METHOD OF MANUFACTURING THE RESISTIVE MEMORY DEVICE

(71) Applicant: SK hynix Inc., Icheon-si (KR)

(72) Inventors: Hyuck Sang Yim, Seoul (KR); Myung Sun Song, Incheon (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/909,663

(22) Filed: Jun. 23, 2020

(65) Prior Publication Data

US 2020/0321519 A1    Oct. 8, 2020

Related U.S. Application Data

(63) Continuation of application No. 16/210,806, filed on Dec. 5, 2018, now Pat. No. 10,727,403.

(30) Foreign Application Priority Data

May 4, 2018   (KR) .......................... 10-2018-0051792

(51) Int. Cl.
| | | |
|---|---|---|
| *H01L 45/00* | (2006.01) | |
| *H01L 27/24* | (2006.01) | |
| *G11C 7/18* | (2006.01) | |
| *G11C 8/14* | (2006.01) | |
| *G11C 13/00* | (2006.01) | |

(52) U.S. Cl.
CPC ................ *H01L 45/06* (2013.01); *G11C 7/18* (2013.01); *G11C 8/14* (2013.01); *G11C 13/0004* (2013.01); *H01L 27/2463* (2013.01); *H01L 45/1253* (2013.01); *H01L 45/144* (2013.01); *H01L 45/1666* (2013.01)

(58) Field of Classification Search
CPC . H01L 45/06; H01L 45/1253; H01L 45/1666; H01L 27/2463; G11C 7/18; G11C 8/14; G11C 13/0004
USPC .......................................................... 257/4
See application file for complete search history.

(56) References Cited

U.S. PATENT DOCUMENTS

| | | | |
|---|---|---|---|
| 9,350,356 B2 | 5/2016 | Tatsumura et al. | |
| 9,450,025 B2 | 9/2016 | Jung et al. | |
| 10,727,403 B2 * | 7/2020 | Yim ..................... | H01L 45/1253 |

FOREIGN PATENT DOCUMENTS

KR    1020180024547 A    3/2018

\* cited by examiner

*Primary Examiner* — Tong-Ho Kim
(74) *Attorney, Agent, or Firm* — William Park & Associates Ltd.

(57) ABSTRACT

A resistive memory device may include a plurality of MATs, row control blocks, a plurality of word lines, a plurality of bit lines and memory cells. Each of the row control blocks may be interposed between the MATs. Each of the row control blocks may include a control element. The word lines may be arranged spaced apart from each other by a substantially uniform gap on the MATs. The bit lines may overlap with the word lines. The memory cells may be located between the word lines and the bit lines. Each of the word lines may be electrically connected with the control element of each of the row control blocks via a connection path.

6 Claims, 12 Drawing Sheets

RESISTIVE MEMORY DEVICE AND METHOD OF MANUFACTURING THE RESISTIVE MEMORY DEVICE

CROSS-REFERENCES TO RELATED APPLICATION

The present application is a continuation application of U.S. patent application Ser. No. 16/210,806, filed on Dec. 5, 2018, and claims priority under 35 U.S.C. § 119(a) to Korean application number 10-2018-0051792, filed on May 4, 2018, in the Korean Intellectual Property Office, which is incorporated herein by reference in its entirety.

BACKGROUND

1. Technical Field

Various embodiments generally relate to a resistive memory device and a method of manufacturing the same, more particularly, to a phase changeable memory device having a cross point array structure, and a method of manufacturing the phase changeable memory device.

2. Related Art

Resistive memory devices, including phase changeable memory devices, may use a phase changeable material as a data storage medium and a switching element. The data storage medium and the switching element including the phase changeable material may be located at intersected points between word lines and bit lines. A memory type having the above-mentioned structure may be referred to as a cross point array structure.

The phase changeable memory device having the cross point array structure may include a near memory cell adjacent to a control block, and a far memory cell remote from the control block. Recently, various techniques for simultaneously compensating a current-concentration of the near memory cell and a signal delay of the far memory cell may be proposed.

SUMMARY

In examples of embodiments of the present disclosure, a resistive memory device may include a plurality of MATs, row control blocks, a plurality of word lines, a plurality of bit lines and memory cells. Each of the row control blocks may be interposed between the MATs. Each of the row control blocks may include a control element. The word lines may be arranged spaced apart from each other by a substantially uniform gap on the MATs. The bit lines may overlap with the word lines. The memory cells may be located between the word lines and the bit lines. Each of the word lines may be electrically connected with the control element of each of the row control blocks via a connection path.

In examples of embodiments of the present disclosure, a resistive memory device may include a semiconductor substrate, control elements, a plurality of lower word lines, a plurality of bit lines, a plurality of upper word lines and memory cells. The semiconductor substrate may include a plurality of MAT regions, a plurality of row control regions and a plurality of column control regions. The row control regions may be positioned between the MAT regions. The column control regions may be positioned between the MAT regions. The control elements may be arranged on the semiconductor substrate defined by the row control regions and the column control regions. The lower word lines may be connected with at least one MAT in the MAT regions and the control element of a first row control region among the row control regions adjacent to the at least one MAT. The bit lines may extend over the lower word lines along a columnar direction. The bit lines may cross with the lower word lines. The upper word lines may be arranged over the bit lines. The upper word lines may be partially overlapped with the lower word lines. The upper word lines may be connected with the control element of a second row control region among the row control regions. The memory cells may be arranged between the lower word lines and the bit lines, and between the bit lines and the upper word lines. The lower word lines and the control element in the first row control region may be electrically connected with each other via a connection path. The upper word lines and the control element in the second row control region may be electrically connected with each other via the connection path.

In examples of embodiments of the present disclosure, pertaining to a method of manufacturing a resistive memory device, a semiconductor substrate having a plurality of MAT regions and a plurality of row control regions between the MAT regions may be prepared. A local word line switch may be formed over a portion of the semiconductor substrate corresponding to the row control region. An insulating structure may be formed over the local word line switch. The insulating structure may include a connection path having a structure connected with the local word line switch.

In example embodiments, a connection path having a direct structure may be used in place of the connection path having the spiral bypass structure.

DETAILED DESCRIPTION

Various embodiments will be described with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the appended claims.

The embodiments are described herein with reference to cross-section and/or plan illustrations. However, embodiments of should not be construed as limiting. Although a few embodiments will be illustrated and described, it will be appreciated by those of ordinary skill in the art that changes may be made in these embodiments without departing from the principles and spirit of the present disclosure.

Figure 1:
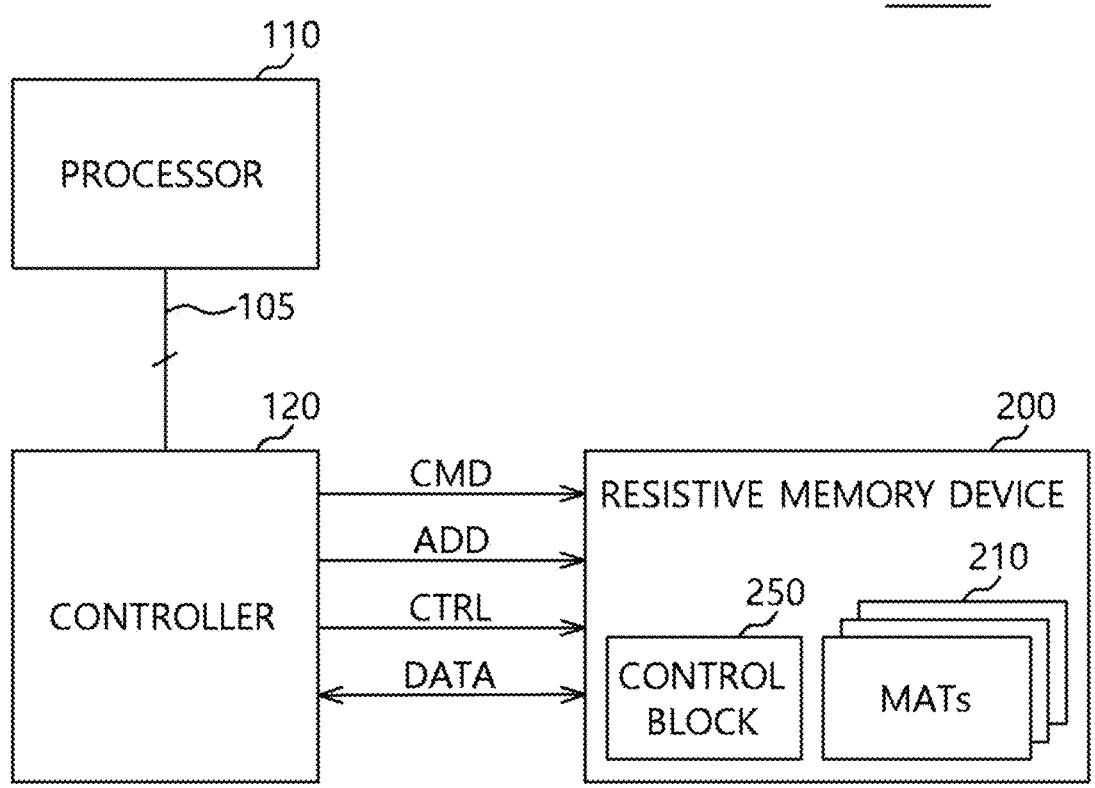
FIG. 1 is a block diagram illustrating a semiconductor system in accordance with an embodiment.

FIG. 1 is a block diagram illustrating a semiconductor system in accordance with an embodiment.

Referring to FIG. 1, a semiconductor system 100 of an embodiment may include a processor 110, a controller 120 and a resistive memory device 200.

The processor 110 may be connected with the controller 120 via a bus 105. The processor 110 may provide the controller 120 with memory access requests including a memory address and data.

The controller 120 may provide the resistive memory device 200 with commands CMD for operating the resistive memory device 200 such as a read command and a write command, an address ADD, data DATA and a control signal CTRL. The controller 120 may provide data to the resistive memory device 200 or read data in the resistive memory device 200 in response to the read command and the write command.

The resistive memory device 200 may include a cross point array memory type phase changeable memory device. The phase changeable memory device 200 may include a plurality of MATs 210 corresponding to memory cell arrays, and a control block 250. The semiconductor memory system 100 may include a plurality of the phase changeable memory devices as the resistive memory device 200. The phase changeable memory devices may be simultaneously controlled by the controller 120.

Figure 2:
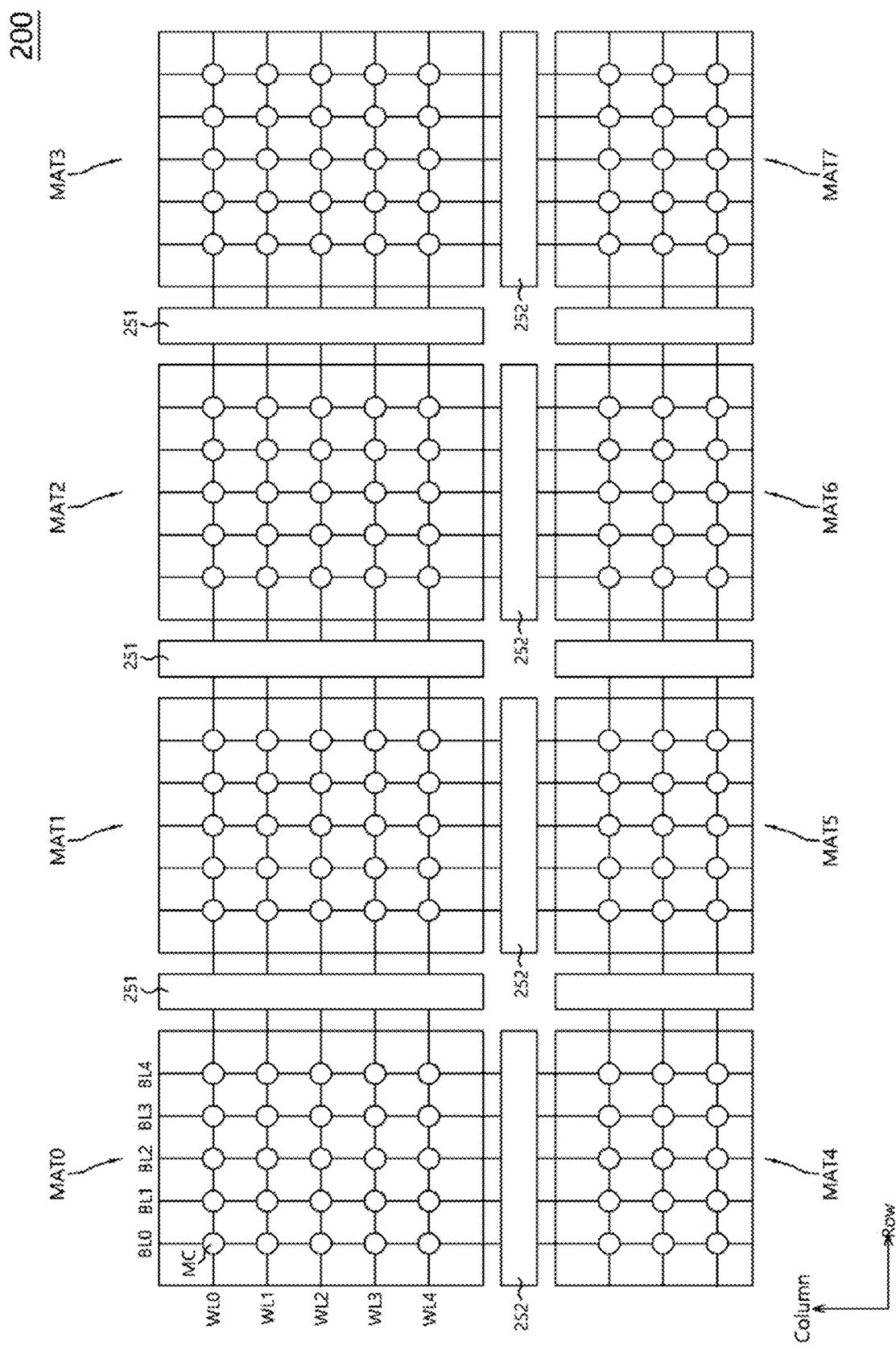
FIG. 2 is a block diagram illustrating a phase changeable memory device in accordance with an embodiment.
Figure 3:
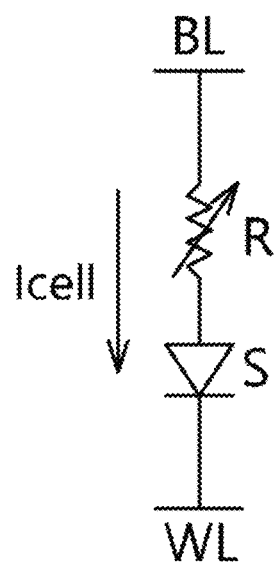
FIG. 3 is a circuit diagram illustrating a memory cell structure in accordance with an embodiment.

FIG. 2 is a block diagram illustrating a phase changeable memory device in accordance with an embodiment, and FIG. 3 is a circuit diagram illustrating a memory cell structure in accordance with an embodiment.

Referring to FIG. 2, the phase changeable memory device 200 may include a plurality of MATs MAT0~MAT7. For example, the MATs MAT0~MAT7 may be arranged in a matrix shape. In an embodiment, the eight MATs may be explained as an example.

However, the phase changeable memory device 200 may include more or less than eight MATs.

The phase changeable memory device 200 may include a plurality of word lines WL0~WL4 and a plurality of bit lines BL0~BL4. The word lines WL0~WL4 may be arranged over the MATS MAT0~MAT7 in a row direction. The bit lines BL0~BL4 may be extended in a column direction. The bit lines BL0~BL4 may be intersected with the word lines WL0~WL4. The phase changeable memory device 200 may further include memory cells MC positioned at intersected points between the word lines WL0~WL4 and the bit lines BL0~BL4. In an embodiment, the word lines may cross over or under the bit lines. In an embodiment, the word lines may cross over or under the bit lines substantially perpendicular to one another. In an embodiment, the bit lines may overlap with the word lines or the word lines may overlap with the bit lines.

In an embodiment, the MATs MAT0~MAT7 including the five word lines WL0~WL4 and the five bit lines BL0~BL4 may be explained as an example. However, numbers of the word lines WL and the bit lines BL may be changed in accordance with an integration degree of the memory device.

The phase changeable memory device 200 may include a row control block 251 and a column control block 252 as parts of the control block 250.

The row control block 251 may be arranged between the adjacent MATs MAT0~MAT7 arranged in the row direction. The word lines WL0~WL4 may be selected by the adjacent row control block 251. For example, the row control block 251 may include local word line switches and global word line switches.

The column control block 252 may be arranged between the adjacent MATs MAT0~MAT7 arranged in the column direction. The bit lines BL0~BL4 may be selected by the adjacent column control block 252. For example, the column control block 252 may include local bit line switches and global bit line switches.

In an embodiment, the local word line switches, the global word line switches, the local bit line switches and the global bit line switches may include MOS transistors.

The memory cell MC may be selectively turned-on by a voltage difference between a corresponding bit line and a corresponding word line. When the voltage difference between a bit line and a word line connected to the memory cell MC is no less than a threshold voltage, the memory cell MC may be turned-on.

Referring to FIG. 3, the memory cell MC may include a variable resistance R and a selection element S. For example, the variable resistance R may be connected between the bit line BL and the selection element S. The selection element S may be connected between the variable resistance R and the word line WL.

The variable resistance R of the memory cell R may have resistance state changed by a current or a voltage applied to the bit line BL. For example, the variable resistance R may include a phase changeable layer having crystalline state changed by a current amount or a resistance changeable layer. The phase changeable layer may include GaSb, InSb, InSe, $Sb_2Te_3$, GeTe, GeSbTe, GaSeTe, InSbTe, $SnSb_2Te_4$, InSbGe, AgInSbTe, (GeSn)SbTe, GeSb(SeTe), $Te_{81}Ge_{15}Sb_2S_2$, etc. The phase changeable layer may have an amorphous state having a relatively high resistance and a crystalline state having a relatively low resistance. The phases of the phase changeable layer may be changed by Joule's heat generated by the current amount and a cooling time.

In an embodiment, the selection element S may include a phase changeable layer. For example, the selection element S may include an Ovonic threshold switch. In FIG. 3, the direction of a current Icell is illustrated.

Figure 4:
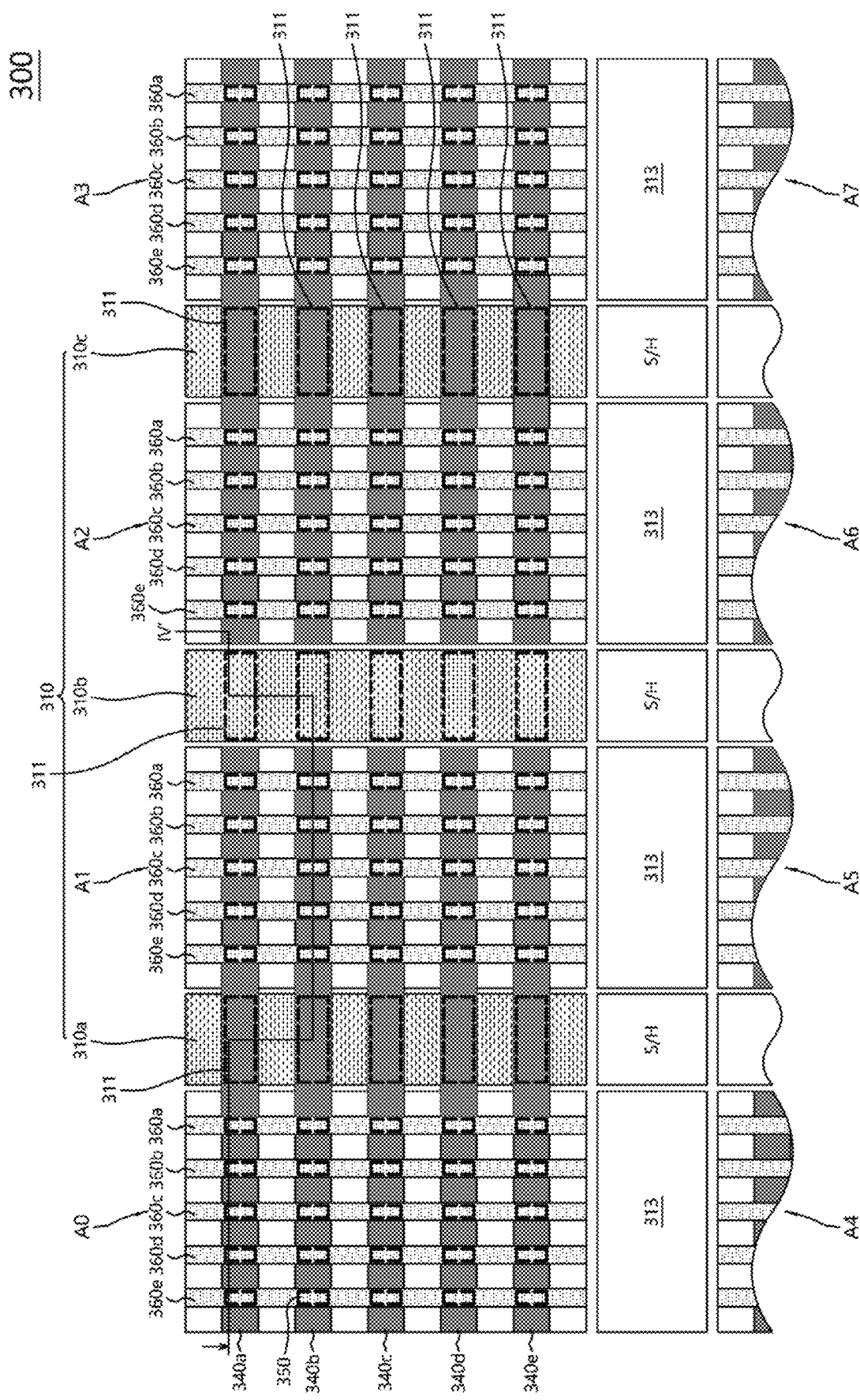
FIG. 4 is a plan view illustrating a layout of the phase changeable memory device in FIG. 2.

FIG. 4 is a plan view illustrating a layout of the phase changeable memory device in FIG. 2.

Referring to FIG. 4, a semiconductor substrate 300 may include a plurality of MAT regions A0~A7, a row control region 310 and a column control region 313.

A plurality of memory cells may be formed in the MAT regions A0~A7. The MAT regions A0~A7 may be defined by a matrix shape. The row control region 310 may be positioned between the MAT regions A0~A7 defined in the row direction. The column control region 313 may be positioned between the MAT regions A0~A7 defined in the column direction.

A plurality of word lines 340a~340e may be arranged spaced apart from each other by a substantially uniform interval on the semiconductor substrate 300. In order to decrease a signal delay caused by a line resistance, the word lines 340a~340e may have a length for covering the adjacent two MATs. In this example, the word line may have a length for covering one MAT. The word lines 340a~340e may be electrically connected with a control element in the row control region between the two MATs A0~A7. Thus, the word lines 340a~340e may be controlled by the control element.

A plurality of bit lines 360a~360e may be arranged over the semiconductor substrate 300 with the word lines 340a~340e. The bit lines 360a~360e may be arranged spaced apart from each other by a substantially uniform interval in the column direction so that the bit lines 360a~360e may be intersected with the word lines 340a~340e. In order to decrease a signal delay caused by a line resistance, the bit lines 360a~360e may have a length for covering the adjacent two MATs (i.e., A0 and A4, A1 and A5, A2 and A6, and A3 and A7).

Memory cells 350 may be positioned at intersected points between the word lines 340a~340e and the bit lines 360a~360e. [FIG. 4, to avoid an objection to FIG. 4 the element 'S/H' should be defined in the detailed description.]

Figure 5:
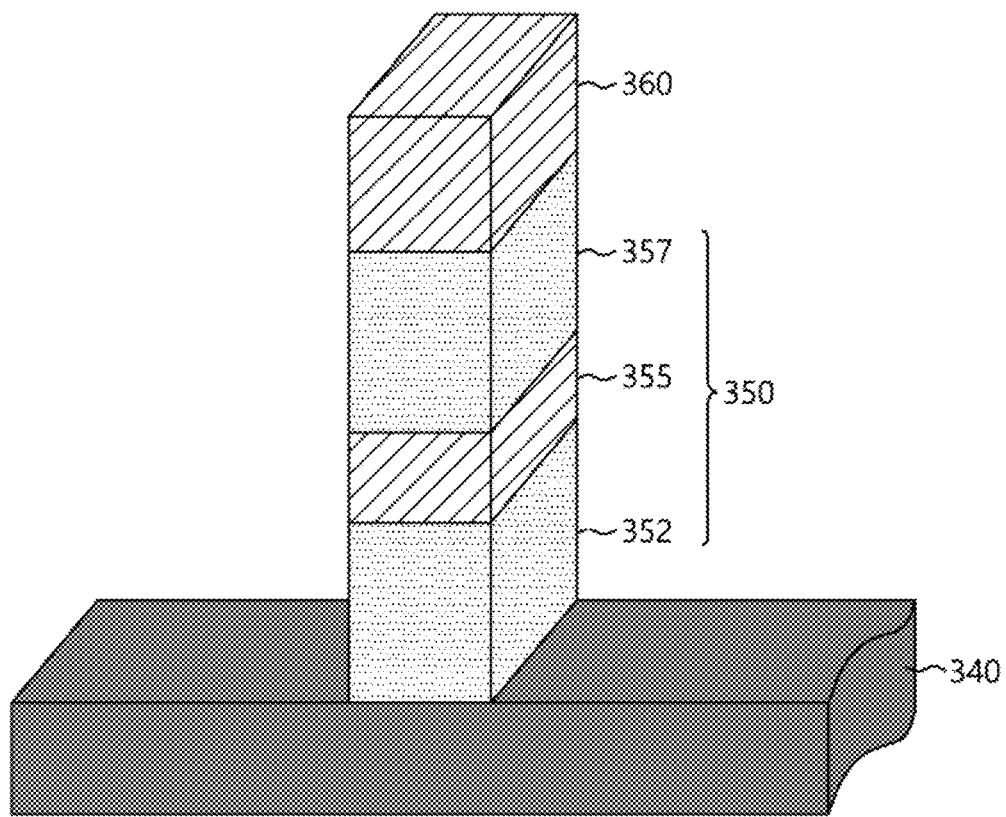
FIGS. 5 and 6 are perspective views illustrating a memory cell in accordance with an embodiment.
Figure 6:
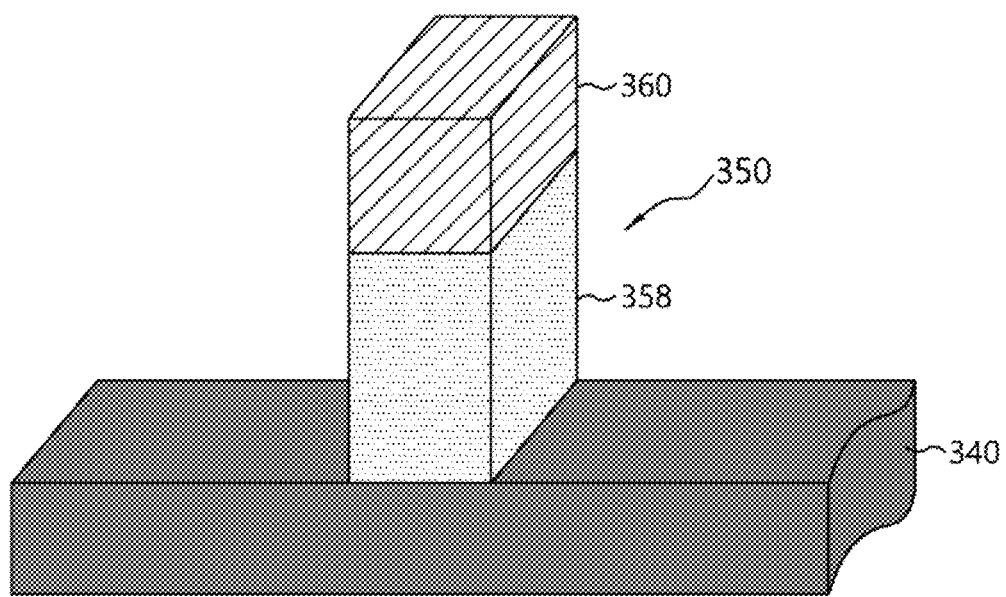

FIGS. 5 and 6 are perspective views illustrating a memory cell in accordance with an embodiment.

Referring to FIG. 5, the memory cell 350 may include a first phase changeable layer 352, a middle electrode 355 and a second phase changeable layer 357.

The first phase changeable layer 352 may be formed on the word line 340. The first phase changeable layer 352 may include a chalcogenide material. The middle electrode 355 may be formed on the first phase changeable layer 352. For example, the middle electrode 355 may include a conductive layer having a specific resistance higher than that of the word line 340 and the bit line 360. The second phase changeable layer 357 may be formed between the middle electrode 355 and the bit line 360. The second phase changeable layer 357 may include a chalcogenide material.

When the first and second phase changeable layers 352 and 357 include the chalcogenide material, the first and second phase changeable layers 352 and 357 may have different phase change characteristics. For example, the first phase changeable layer 352 may be used as the selection element S and the second phase changeable layer 357 may be used as the variable resistance R.

A heating electrode may be inserted between the word line 340 and the first phase changeable layer 352, and between the bit line 360 and the second phase changeable layer 357.

Referring to FIG. 6, the memory cell MC may include a single phase changeable layer 358. The single phase changeable layer 358 may have a switching function and a memory function.

Referring to FIG. 4, a local word line switch 311 and a global word line switch as the control element may be arranged on the row control region 310. The row control region 310 may correspond to a region of the semiconductor substrate 300 in which the row control block 251 may be formed. In an embodiment, the row control block 251 may include a plurality of control elements including at least one of a local word line switch 311 (i.e., 311odd or 311even) and a global word line switch. In an embodiment, the control element may include at least one of a local word line swith 311odd and 311even.

A local bit line switch and a global bit line switch may be arranged on the column control region 313. The column control region 313 may correspond to a region of the semiconductor substrate 300 in which the column control block 252 may be formed.

The local word line switch 311, the global word line switch, the local bit line switch and the global bit line switch may be formed with fabrication processes on the semiconductor substrate before forming the word lines 340a~340e.

Figure 7:
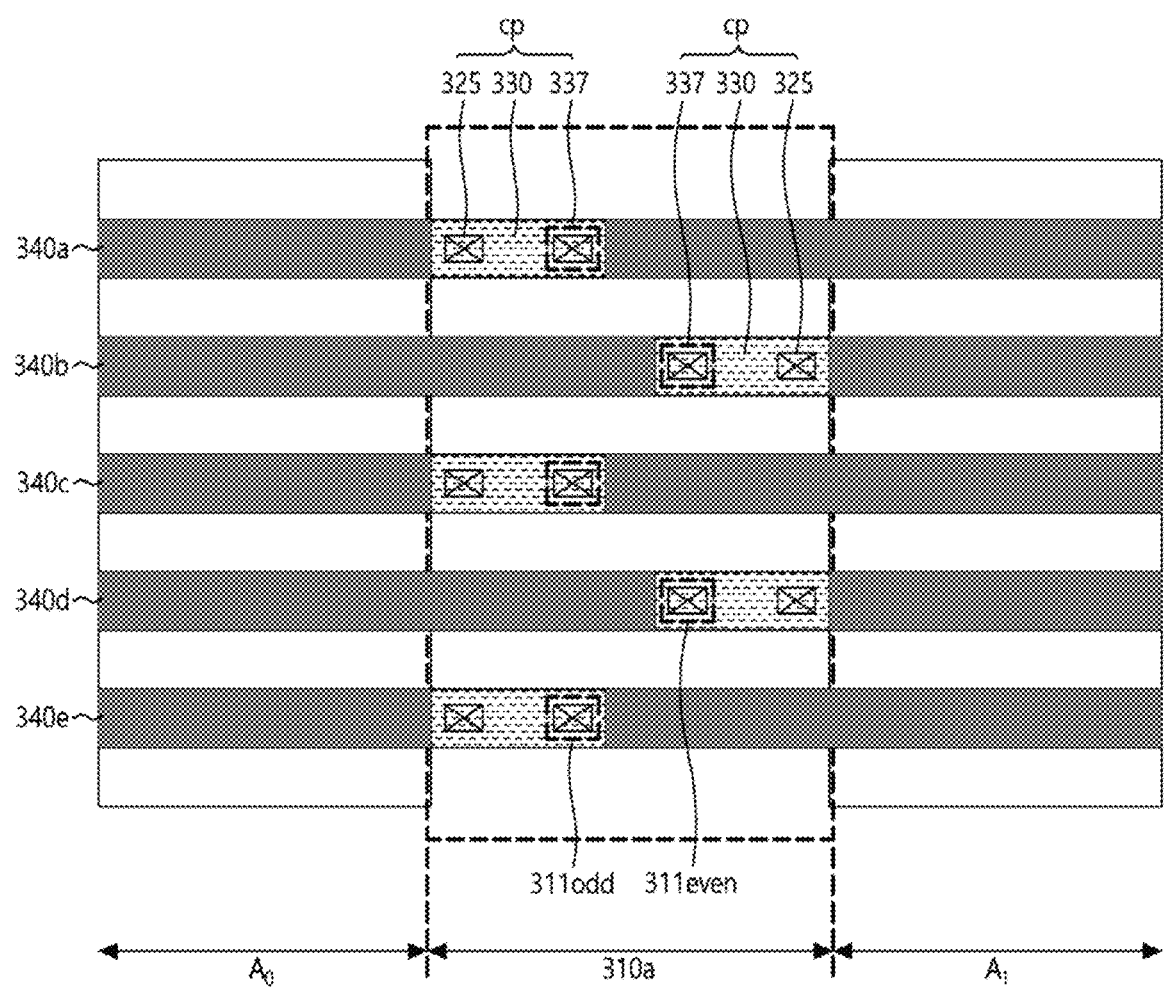
FIG. 7 is an enlarged view illustrating a row control region in FIG. 4 for illustrating connection relations between a local word line switch and a word line in accordance with an embodiment.
Figure 8:
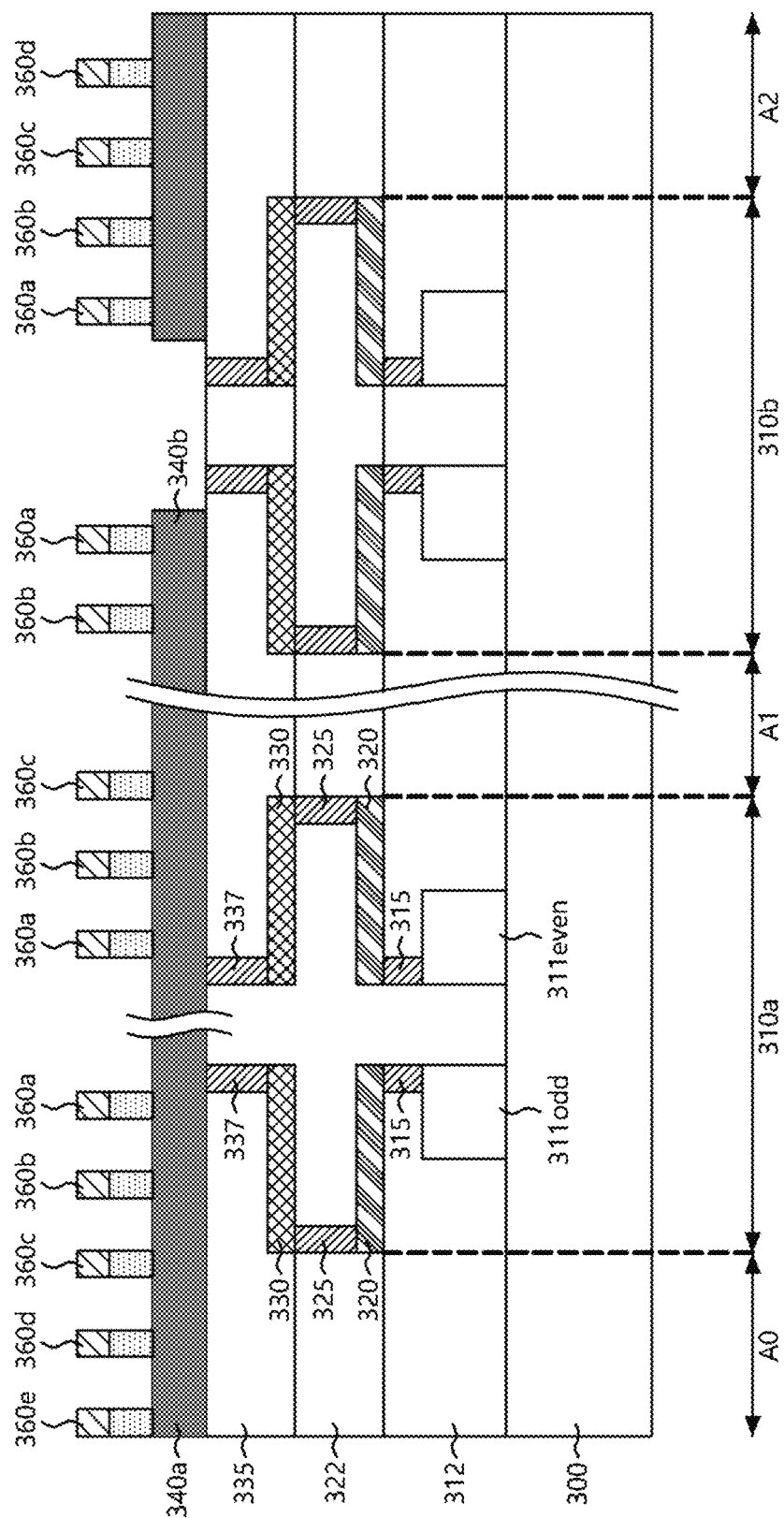
FIG. 8 is a cross-sectional view taken along a line IV-IV' in FIG. 4.

FIG. 7 is an enlarged view illustrating a row control region in FIG. 4 for illustrating connection relationships between a local word line switch and a word line in accordance with an embodiment, and FIG. 8 is a cross-sectional view taken along a line IV-IV' in FIG. 4. FIG. 7 shows a first row control region 310a between the first MAT A0 and the second MAT A1. The FIG. 8 shows cross-sectional views of the first and second MATs A0 and A1 and a second row control region 310b between the second and third MATs A1 and A2. The bit lines may be omitted in FIG. 7 for brevity. FIG. 4 also illustrates a third row control region 310c between third and fourth MATs A2 and A3.

Referring to FIGS. 4, 7 and 8, the first row control region 310a may include a region in which the word lines 340a~340e may be formed. In order to improve layout efficiency, a first local word line switch 311odd may be arranged in a region in which odd word lines 340a, 340c and 340e among the word lines 340a~340e may be positioned. A second local word line switch 311even may be arranged in a region in which even word lines 340b and 340d among the word lines 340a~340e may be positioned. The first local word line switch 311odd may be arranged in the odd word line region adjacent to the first MAT A0. The second local word line switch 311even may be arranged in the even word line region adjacent to the second MAT A1. Because the first and second local word line switches 311odd and 311even may be arranged in a zigzag pattern, connection paths connected between the first and second local word line switches 311odd and 311even and the word line may also be arranged in the zigzag pattern on a horizontal plane. In an embodiment, the connection path CP may be positioned at a region 310 where the word line (i.e., 340) of the row control block 251 is arranged, the connection path CP connected with an odd word line (i.e., 340a) among the word lines (i.e., 340a to 340e) may be arranged at a first side portion of the row control block 251, and the connection path CP connected with an even word line (i.e., 340b) among the word lines (i.e., 340a to 340e) may be arranged at a second side portion of the row control block 251 opposite to the first side portion in a zigzag pattern (i.e., see the connection paths CP of FIG. 7).

The first and second local word line switches 311odd and 311even may include at least one of MOS transistors. A first insulating interlayer 312 may be formed on the semiconductor substrate 300 with the first and second local word line switches 311odd and 311even.

The first insulating interlayer 312 may be etched to form a first via hole configured to expose the first and second local word line switches 311odd and 311even. The first via hole may be filled with a conductive material to form a first plug 315 in the first insulating interlayer 312. For example, the first plug 315 may be connected to a drain of the first and second local word line switches 311odd and 311even, respectively.

A first wiring 320 may be formed on the first insulating interlayer 312. The first wiring 320 may make contact with the first plug 315. For example, the first wiring 320 may include a conductive material. A first edge portion of a bottom surface of the first wiring 320 may electrically make contact with the first plug 315. A second insulating interlayer 322 may be formed on the first insulating interlayer 312 with the first wiring 320. The second insulating interlayer 322 may be etched to form a second via hole configured to expose a second edge portion of the first wiring 320 opposite to the first edge portion. The second via hole may be filled with a conductive material to form a second plug 325. The second plug 325 may be connected to the second edge portion of an upper surface of the first wiring 320 opposite to the first edge portion.

A second wiring 330 may be formed on the second insulating interlayer 322. The second wiring 330 may make contact with the second plug 325. The second wiring 330 may include a conductive material. The second wiring 330 may have a size substantially the same as that of the first wiring 320. For example, the second wiring 330 may be formed using a mask for defining the first wiring 320. In an embodiment, the second wiring 330 may be arranged on the second plug and may overlap with the first wiring 320 either partially, substantially, or entirely.

A third insulating interlayer 335 may be formed in the second insulating interlayer 322 with the second wiring 330. The third insulating interlayer 335 may be etched to form a third via hole configured to expose the second wiring 330. For example, a position of the third via hole may correspond to the first plug 315. Further, the third via hole may be formed using a mask (not shown) for forming the first via hole. The third via hole may be filled with a conductive material to form a third plug 337. In an embodiment, the third plug 337 may be connected between an edge portion of the second wiring 330 and the word line 340a. In an embodiment, the third plug 337 may be formed substantially over the location of the first plug 315.

The word lines 340a~340e may be formed on the third insulating interlayer 335. The word lines 340a~340e may make contact with the third plug 337. The odd word lines 340a, 340c and 340e may electrically make contact with the third plug 337 adjacent to the first MAT A0 (a left MAT in FIG. 7). The even word lines 340b and 340d may electrically make contact with the third plug 337 adjacent to the second MAT A1 (a right MAT in FIG. 7). In order to decrease the signal delay, the word lines 340a~340e may have the length for covering the two MATs.

A phase changeable memory layer and a conductive layer may be sequentially formed on the word lines 340a~340e. The conductive layer and the phase changeable memory layer may be patterned to form a phase changeable memory cell 350 and the bit lines 360a~360e intersected with the MATs A0~A7. The phase changeable memory layer may include a phase changeably layer and a heating electrode.

According to an embodiment, the local word line switches 311odd and 311even and the word lines 340a~340e may be connected with each other through a connection path CP including the first wiring 320, the second wiring 330 and the first to third plugs 315, 320 and 337. Further, the connection path CP may have a bypass structure having a spiral stepped structure, not a straight shape. Therefore, a signal transmission path between the local word line switches 311odd and 311even and the word lines 340a~340e may be relatively extended compared to the straight line so that a resistance may be increased. In an embodiment, a connection path CP having a spiral bypass structure may include a first plug connected to the control element; a first wiring having a first edge portion of a bottom surface of the first wiring, the first edge portion connected to the first plug; a second plug connected to a second edge portion of an upper surface of the first wiring opposite to the first edge portion; a second wiring arranged on the second plug and overlapped with the first wiring; and a third plug connected between an edge portion of the second wiring and the word line.

Figure 9:
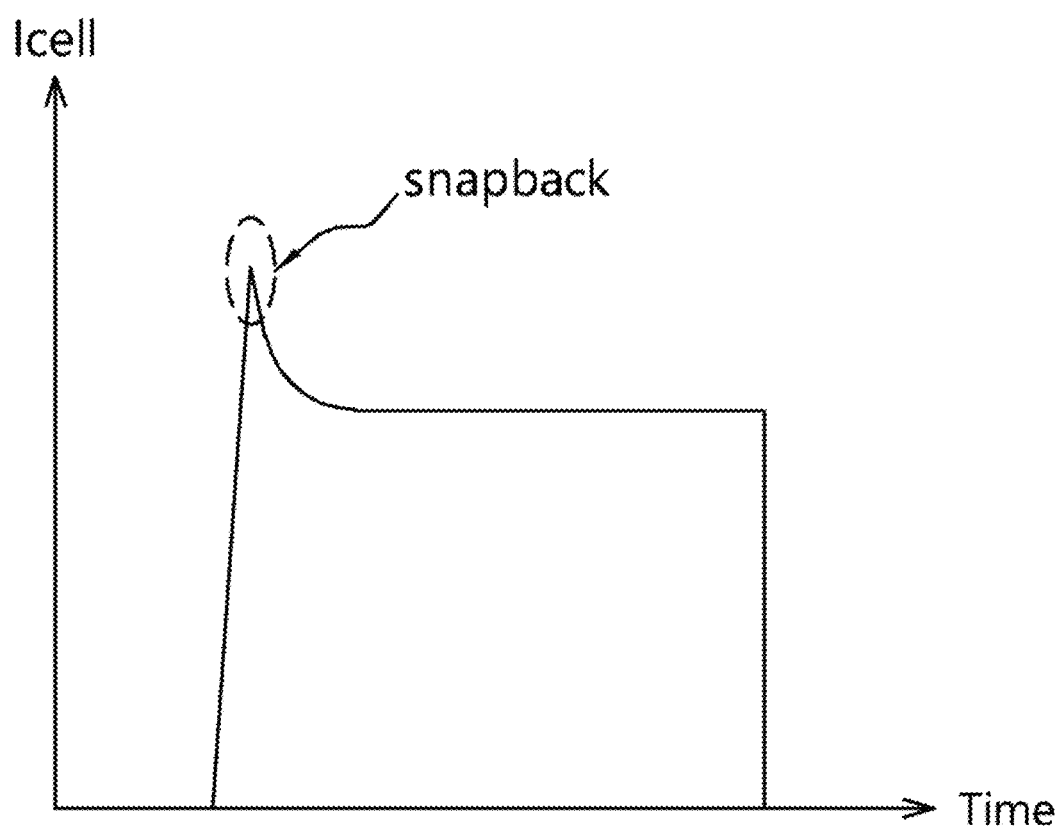
FIG. 9 is a graph showing current characteristics of a phase changeable memory cell in accordance with an embodiment.

FIG. 9 is a graph illustrating current characteristics of a phase changeable memory cell in accordance with an embodiment.

Referring to FIG. 9, when the voltage difference between the word line and the bit line is no less than a threshold voltage A V, the selection element S may be turned-on so that the state of the variable resistance R of the cross point array type phase changeable memory cell may be changed.

When the phase changeable memory cell is turned-on, a snapback in which a current may be temporarily greatly increased may be generated due to characteristics of the phase changeable layer used as the memory layer. The snapback may be greatly generated in the memory cell (hereinafter, referred to as a near memory cell) adjacent to the row control block 250 and the column control block 252.

In order to prevent damages of the phase changeable memory cell caused by the snapback current, the connection structure between the local word line switches 311odd and 311even and the word lines 340a~340e may have the spiral stepped shape, not the straight shape. Thus, the signal transmission path between the local word line switches 311odd and 311even and the word lines 340a~340e may be increased to increase a connection resistance. Therefore, when the memory cell is turned-on, damages caused by a peak current such as the snapback may be decreased by the connection resistance.

Figure 10:
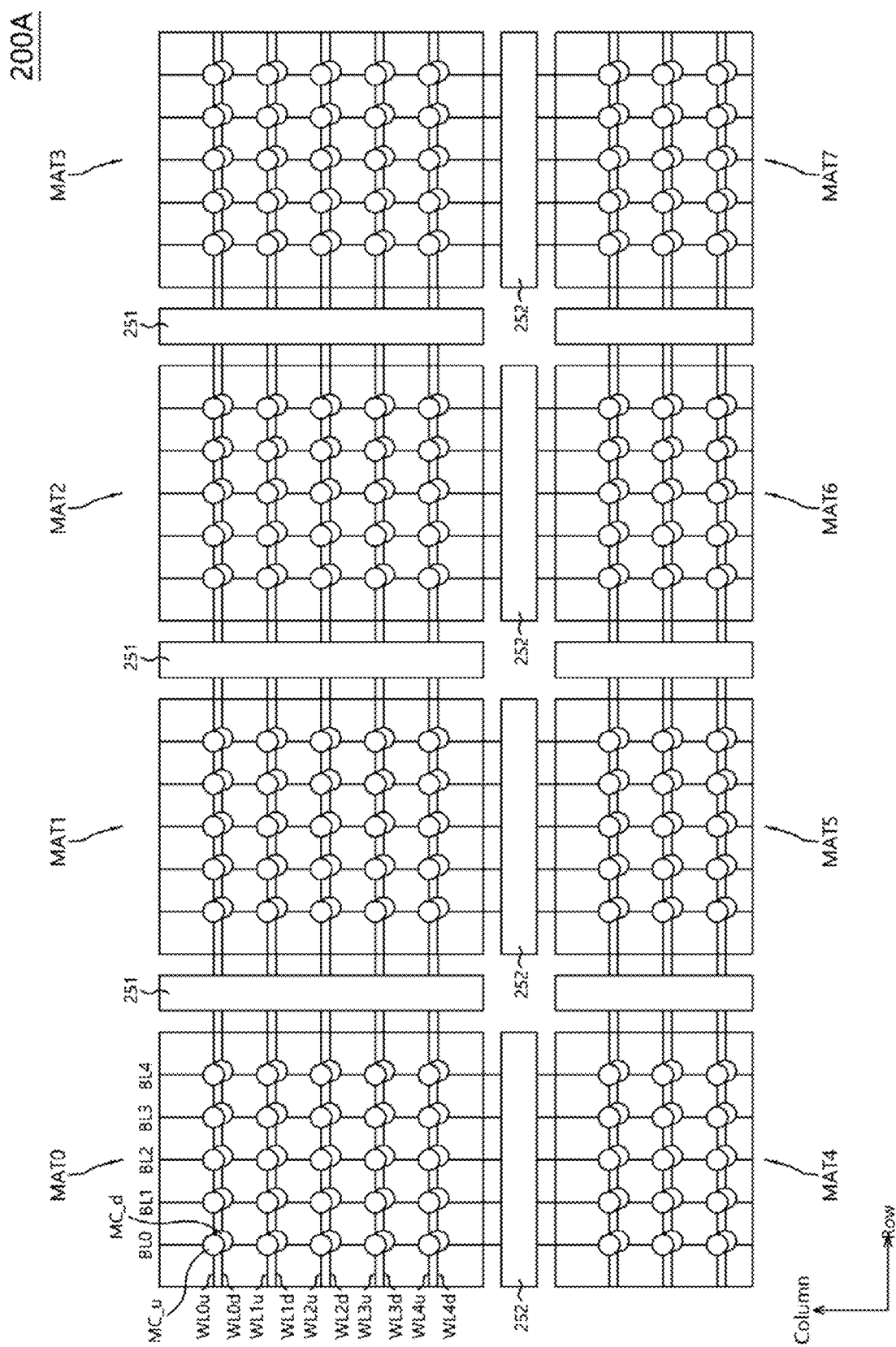
FIG. 10 is a block diagram illustrating a stacked phase changeable memory device in accordance with an embodiment.

FIG. 10 is a block diagram illustrating a stacked phase changeable memory device in accordance with an embodiment. The phase changeable memory device 200A of an embodiment may include elements substantially the same as those of the phase changeable memory device 200 in FIG. 2 except for word lines. Thus, the same reference numerals may refer to the same elements and any further illustrations with respect to the same elements may be omitted herein for brevity.

Referring to FIG. 10, the phase changeable memory device 200A may include lower word lines WL0d~WL4d and upper word lines WL0u~WL4u to form a stacked memory device. The lower word lines WL0d~WL4d may have an arrangement substantially the same as that of the word line WL0~WL4 in FIG. 2. The upper word lines WL0u~WL4u may be positioned over the bit lines BL0~BL4. The upper word lines WL0u~WL4u may overlap with the lower word lines WL0d~WL4d.

The phase changeable memory device 200A may include a lower phase changeable memory cell MC_d and an upper phase changeable memory cell MC_u by the lower and upper word lines WL0d~WL4d and WL0u~WL4u. The lower phase changeable memory cell MC_d may be positioned at intersected points between the lower word lines WL0d~WL4d and the bit lines BL0~BL4. The upper phase changeable memory cell MC_u may be positioned at intersected points between the bit lines BL0~BL4 and the upper word lines WL0u~WL4u.

Figure 11:
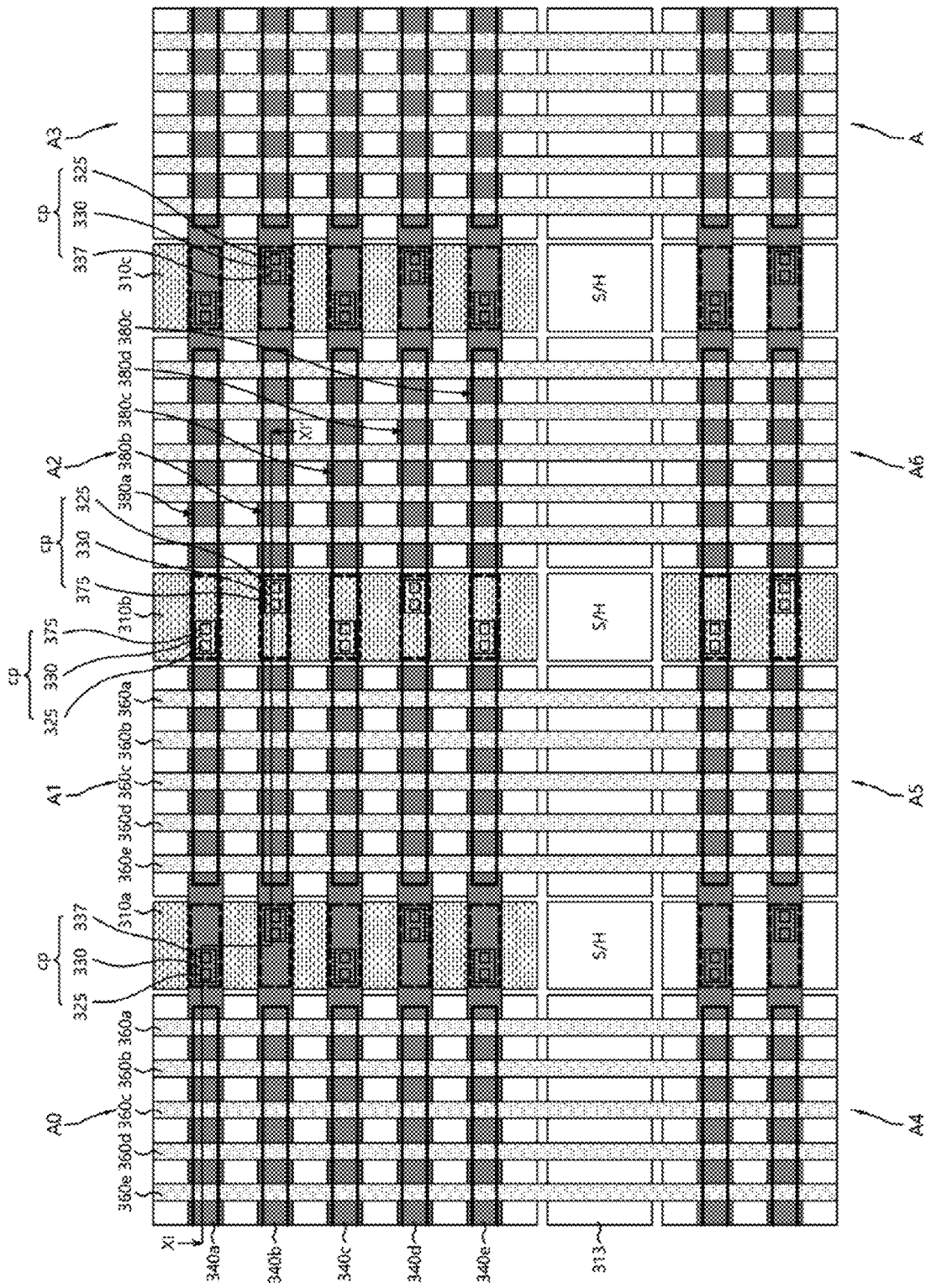
FIG. 11 is a plan view illustrating a layout of the stacked phase changeable memory device in FIG. 10.
Figure 12:
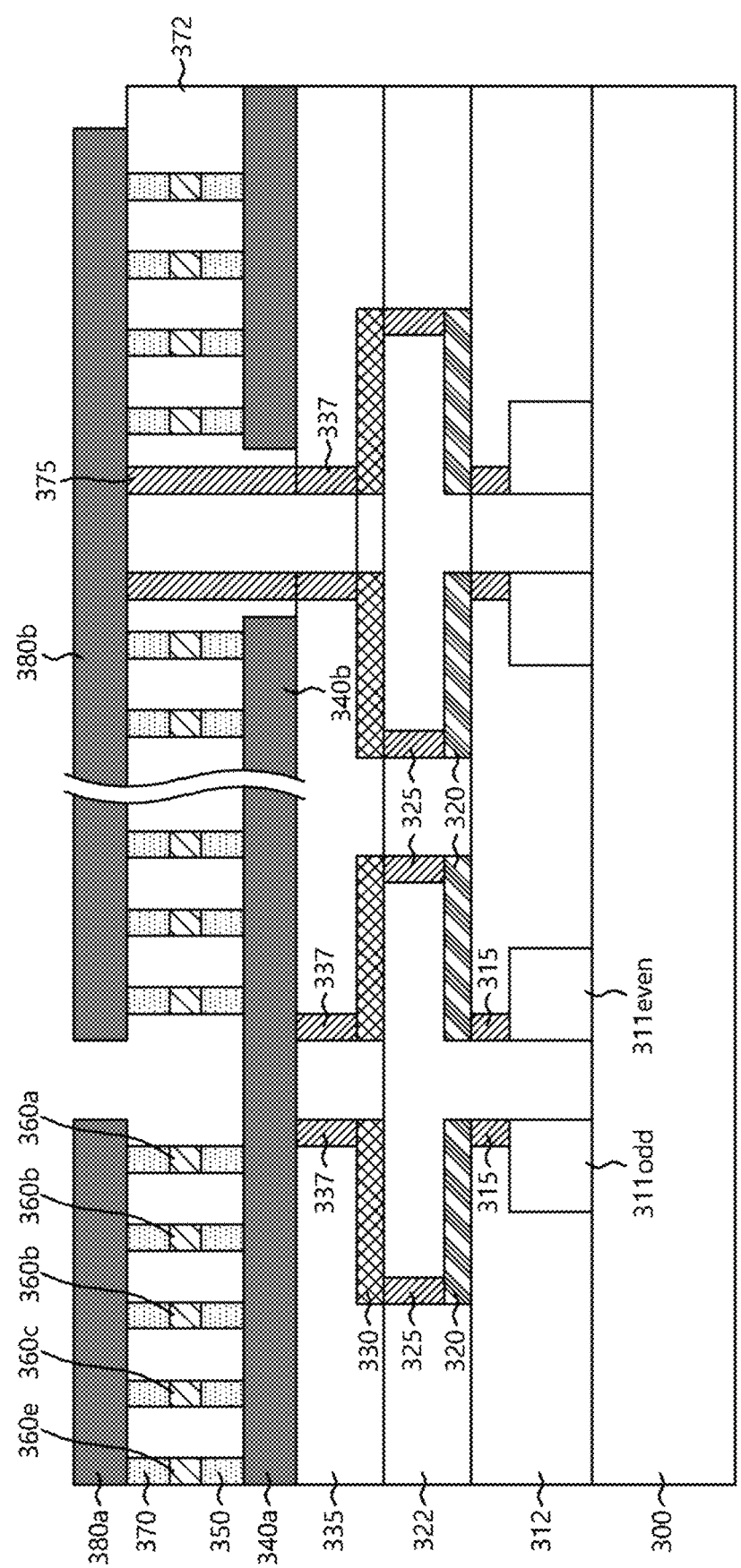
FIG. 12 is a cross-sectional view taken along a line XI-XI' in FIG. 11.

FIG. 11 is a plan view illustrating a layout of the stacked phase changeable memory device in FIG. 10, and FIG. 12 is a cross-sectional view taken along a line XI-XI' in FIG. 11.

Processes for forming the word lines 340a~340e may be substantially the same as those illustrated with reference to FIGS. 4, 7 and 8. Thus, any further illustrations with respect to the same processes may be omitted herein for brevity.

Referring to FIGS. 11 and 12, a first phase changeable layer, a conductive layer (i.e., middle electrode) and a second phase changeable layer may be sequentially formed on the third insulating interlayer 335 with the word lines 340*a*~340*e*.

The second phase changeable layer, the conductive layer and the first phase changeable layer may be patterned to form a second phase changeable memory cell 370, the bit lines 360*a*~360*e* and a first phase changeable memory cell 350. The first phase changeable memory cell 350, the bit lines 360*a*~360*e* and the second phase changeable memory cell 370 may intersect with the word lines 340*a*~340*e*. Each of the first and second phase changeable memory cells 350 and 370 may have a structure substantially the same as that in FIGS. 5 and 6. In an embodiment, the upper word lines 380*a* to 380*e* may overlap with the bit lines 360*a*~360*e* and upper memory cells 370 may be interposed between the upper word lines 380*a* to 380*e* and the bit lines 360*a*~360*e*. In an embodiment, the bit lines 360*a*~360*e* may overlap with lower word lines 340*a* to 340*e* and lower memory cells 350 may be interposed between the lower word lines 340*a* to 340*e* and the bit lines 360*a*~360*e*.

A fourth insulating interlayer 372 may be formed on the third insulating interlayer 335 with the word lines 340*a*~340*e*, the first phase changeable memory cell 350, the bit lines 360*a*~360*e* and the second phase changeable memory cell 370. The fourth insulating interlayer 372 may be planarized to have a flat surface configured to expose the second phase changeable memory cell 370.

The fourth insulating interlayer 372 may be partially etched to form a fourth via hole configured to expose the third plug 337 on the even row control regions 310*b* and 310*d*. The fourth via hole may be filled with a conductive material to form a fourth plug 375. The fourth plug 375 may make contact with the third plug 337.

A conductive layer may be formed on the fourth insulating interlayer 372 with the fourth plug 375. The conductive layer may be patterned to form upper word lines 380*a*~380*e*. The upper word lines 380*a*~380*e* may be overlapped with the lower word lines 340*a*~340*e*. The upper word lines 380*a*~380*e* may be substantially parallel to the lower word lines 340*a*~340*e*.

Therefore, the second phase changeable memory cell 370 may be defined between the bit lines 360*a*~360*e* and the upper word lines 380*a*~380*e*.

The upper word lines 380*a*~380*e* may be electrically connected with the local word line switches 311odd and 311even through the fourth plug 375, the third plug 337, the second wiring 330, the second plug 325, the first wiring 320 and the first plug 315. In an embodiment, a connection path CP between an upper word line and local word line switches 311 may be referred to as an additional connection path. The additional connection path may be spaced apart from the connection path CP between a lower word line and the local word line switches 311 by a width. For example, the width may be the width of one MAT.

As mentioned above, the upper word lines 380*a*~380*e* may be overlapped with the lower word lines 340*a*~340*e*.

Further, the upper word lines 380*a*~380*e* may be shifted from the lower word lines 340*a*~340*e* by a width of one MAT, i.e., a length of the MAT in an extending direction of the word line.

For example, when the lower word lines 340*a*~340*e* extend over the first to fourth MATs A0, A1, A2 and A3 without disconnection, the upper word lines 380*a*~380*e* may extend over the second to fifth MATs A1, A2, A3 and A4 without disconnection.

The odd upper word lines 380*a*, 380*c* and 380*e* among the upper word lines 380*a*~380*e* may be electrically connected with the fourth plug 375 adjacent to the second MAT A1 arranged on a left side of the row control region 310*b*. The even upper word lines 380*b* and 380*d* among the upper word lines 380*a*~380*e* may be electrically connected with the fourth plug 375 adjacent to the third MAT A2 arranged on a right side of the row control region 310*b*.

According to an embodiment, the upper word lines 380*a*~380*e* may be connected with the local word line switches 311odd and 311even through the connection path CP (i.e., 325, 330, 337, and 375) having the spiral stepped structure to decrease the peak current by the snapback.

Figure 13:
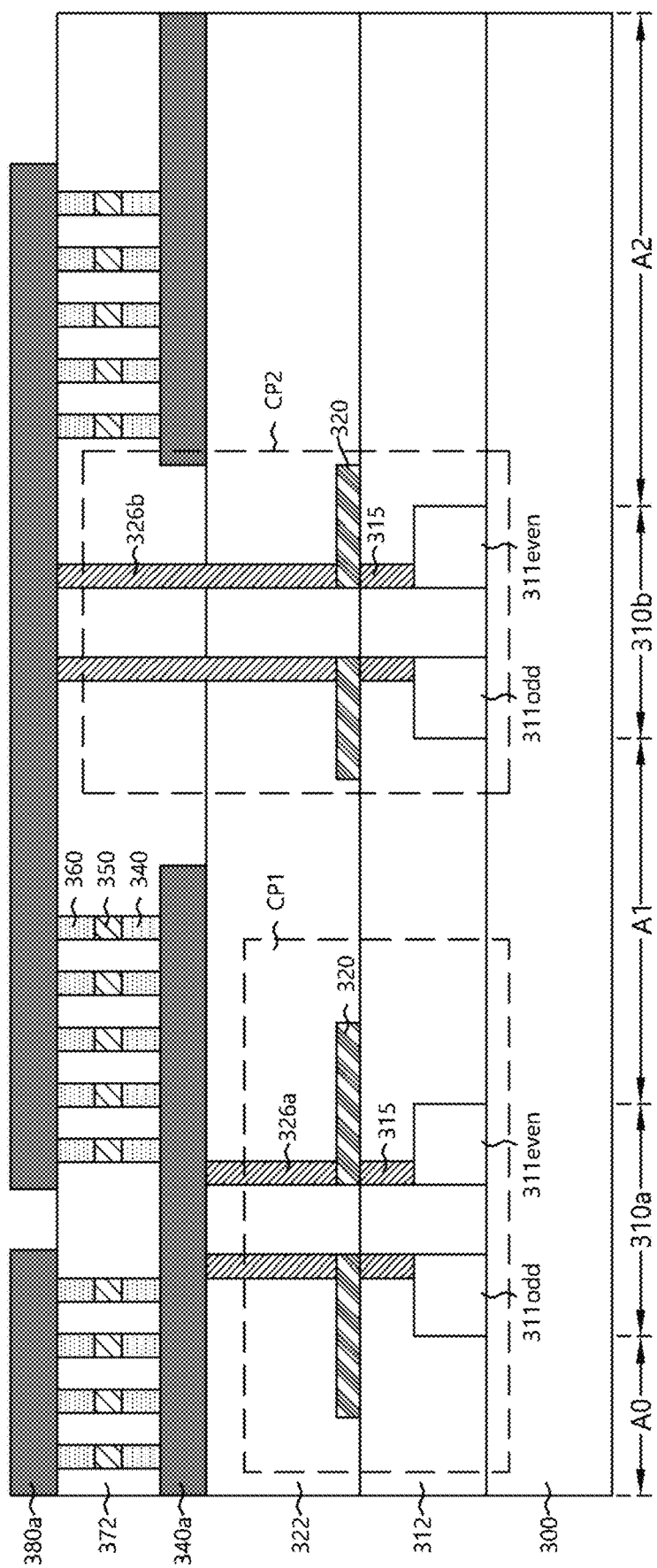
FIG. 13 is a cross-sectional view illustrating a stacked phase changeable memory device in accordance with an embodiment.

FIG. 13 is a cross-sectional view illustrating a stacked phase changeable memory device in accordance with an embodiment.

Although the phase changeable memory device may include the bypass type connection path due to the snapback of OTS and GST, the bypass structure may not be required in the phase changeable memory device when a new phase changeable material, a new circuit and a new voltage applying technique is proposed.

In this example, referring to FIG. 13, the connection path CP having the spiral stepped structure may be revised to be direct connection paths CP1 and CP2.

The direct connection paths CP1 and CP2 may be formed by omitting the processes for forming the second wiring 330 and the third plug 337 or the fourth plug 375. In the direct connection path CP1 and CP2, second plugs 326*a* and 326*b* may be formed at positions corresponding to the first plug 315. In an embodiment the second plug 326*a* may be formed substantially over the location of the first plug 315. In an embodiment, the second plug 326*b* may be formed substantially over the location of the first plug 315.

The lower word lines 340*a*~340*e* and the upper word lines 380*a*~380*e* may directly make contact with the plugs 326*a* and 326*b* connected to the first wiring 320. Thus, the connection paths CP1 and CP2 may be formed without an additional process. A signal delay of a far cell may not be generated due to the direct connection paths CP1 and CP2.

According to an embodiment, the upper and lower word lines 380*a*~380*e* and 340*a*~340*e* may be connected to the local word line switches 311odd and 311even of the row control region 310 (i.e., 310*a* and 310*b* etc.) through the bypath connection path having the spiral stepped structure to decrease damages of the memory cell caused by the peak current such as the snapback. Further, the bypass connection path may be revised to the direct connection structure by omitting the processes.

The above described embodiments are intended to illustrate and not to limit the description. Various alternatives and equivalents are possible. The description is not limited by the embodiments described herein. Nor is the description limited to any specific type of semiconductor device. Other additions, subtractions, or modifications are obvious in view of the present disclosure and are intended to fall within the scope of the appended claims.

What is claimed is:

1. A method of manufacturing a resistive memory device, the method comprising:
   providing a semiconductor substrate having a plurality of memory cell arrays (MAT) regions and a plurality of row control regions between the MAT regions;

forming a local word line switch on the semiconductor substrate corresponding to the row control region; and forming an insulating structure including a connection path having a spiral bypass structure on the local word line switch, the connection path having a structure connected with the local word line switch.

2. The method of claim 1, wherein forming the insulating structure having the connection path comprises:
   forming a first insulating interlayer on the semiconductor substrate with the local word line switch;
   forming a first plug, which is connected with the local word line switch, in the first insulating interlayer;
   forming a first wiring on the first insulating interlayer, the first wiring configured to make contact with the first plug;
   forming a second insulating interlayer on the first wiring;
   forming a second plug, which is connected with the first wiring, in the second insulating interlayer;
   forming a second wiring on the second insulating interlayer;
   forming a third insulating interlayer on the second wiring; and
   forming a third plug, which is connected with the second wiring, in a portion of the third insulating interlayer corresponding to the first plug,
   wherein the word line is formed on the third insulating interlayer to make contact with the third plug.

3. The method of claim 1, wherein the first plug and the third plug are formed at first edge portions of the first and second wirings, and the second plug is formed at a second edge portion of the first and second wirings opposite to the first edge portions.

4. The method of claim 1, further comprising:
   is forming a phase changeable layer on the word line;
   forming a conductive layer on the phase changeable layer; and
   patterning the conductive layer and the phase changeable layer to form a bit line and a phase changeable memory cell intersected with the word line.

5. The method of claim 1, wherein forming the insulating structure having the connection path comprises:
   forming a first insulating interlayer on the semiconductor substrate with the local word line switch;
   forming a first plug, which is connected with the local word line switch, in the first insulating interlayer;
   forming a first wiring on the first insulating interlayer, the first wiring configured to make contact with the first plug;
   forming a second insulating interlayer on the first wiring; and
   forming a second plug, which is connected with the first wiring, in the second insulating interlayer,
   wherein the word line is formed on the second insulating interlayer to make contact with the second plug.

6. The method of claim 1, wherein the second plug is formed at a position corresponding to the first plug.

* * * * *

UNITED STATES PATENT AND TRADEMARK OFFICE
CERTIFICATE OF CORRECTION

| | | |
|---|---|---|
| PATENT NO. | : 10,903,419 B2 | Page 1 of 1 |
| APPLICATION NO. | : 16/909663 | |
| DATED | : January 26, 2021 | |
| INVENTOR(S) | : Hyuck Sang Yim and Myung Sun Song | |

It is certified that error appears in the above-identified patent and that said Letters Patent is hereby corrected as shown below:

In the Claims

Column 12, Lines 4-11, should be corrected to read:
4. The method of claim 1, further comprising:
forming a phase changeable layer on the word line;
forming a conductive layer on the phase changeable layer; and
patterning the conductive layer and the phase changeable layer to form a bit line and a phase changeable memory cell intersected with the word line.

Signed and Sealed this
First Day of June, 2021

Drew Hirshfeld
*Performing the Functions and Duties of the*
*Under Secretary of Commerce for Intellectual Property and*
*Director of the United States Patent and Trademark Office*